US006300821B1

(12) United States Patent
Nakano

(10) Patent No.: US 6,300,821 B1
(45) Date of Patent: Oct. 9, 2001

(54) OUTPUT BUFFER CIRCUIT HAVING CHANGEABLE OUTPUT IMPEDANCE

(75) Inventor: Toshihiko Nakano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/444,990

(22) Filed: Nov. 23, 1999

(30) Foreign Application Priority Data

Dec. 25, 1998 (JP) .................................. 10-371325

(51) Int. Cl.$^7$ ....................................... G05F 1/10
(52) U.S. Cl. ............................ 327/538; 327/540; 326/30
(58) Field of Search ................... 323/293, 352; 326/30; 327/72, 73, 74, 75, 538, 540, 541, 543

(56) References Cited

U.S. PATENT DOCUMENTS

| 5,087,834 | * | 2/1992 | Tsay ........................................ 326/33 |
| 5,485,117 | * | 1/1996 | Furumochi ............................ 327/543 |
| 5,568,083 | * | 10/1996 | Uchiyama et al. .................... 327/538 |
| 5,789,971 | * | 8/1998 | Colletti et al. ......................... 327/108 |
| 5,892,389 | * | 4/1999 | Lai ........................................ 327/543 |
| 5,973,520 | * | 10/1999 | Maruyama ............................. 327/108 |

FOREIGN PATENT DOCUMENTS 8-293780  11/1996  (JP) .
9-261035  10/1997  (JP) .

* cited by examiner

Primary Examiner—Timothy P. Callahan
Assistant Examiner—An T Luu
(74) Attorney, Agent, or Firm—Sughrue, Mion, Zinn, Macpeak & Seas, PLLC

(57) ABSTRACT

An output buffer circuit having adjustable output impedance, including a buffer circuit and a first element which provides a counted value based on a clock signal and outputs the counted value. The output buffer circuit also includes a second element which controls the first element based on an output from the buffer circuit. The control buffer circuit has a third element which receives an input of the counted value and controls the impedance of the buffer circuit based on the counted value. Another embodiment of the output buffer circuit includes a buffer circuit and a first circuit which receives inputs of a reference potential and the potential of an output of the buffer circuit and accordingly controls the buffer circuit so that the potential of the output of the buffer circuit becomes close to the reference potential.

8 Claims, 3 Drawing Sheets

US 6,300,821 B1

OUTPUT BUFFER CIRCUIT HAVING CHANGEABLE OUTPUT IMPEDANCE

BACKGROUND OF THE INVENTION

The present invention relates to an output buffer circuit, and more particularly, to an output buffer whose output impedance can be changed.

As structure for a large scale integrations (LSIs) becomes smaller and smaller, the quality of the LSI may become uneven. This creates a problem because there is a difference in impedance between a one output buffer and another output buffer even in the same LSI. For example, the difference in the impedance between output buffers becomes about +/−30 percent. The difference in the impedance between output buffers produces signal reflection, which deteriorates the performance of the LSI.

SUMMARY OF THE INVENTION

An object of the invention is to provide an output buffer circuit whose output impedance can be changed.

According to one aspect of the present invention, an output buffer circuit is provided which includes: a buffer circuit; a first element which counts to a value based on a clock signal and outputs the counted value; a second element which controls the first element based on an output from the buffer circuit; and a third element which inputs the counted value and controls the impedance of the buffer circuit based on the counted value.

According to another aspect of the present invention, an output buffer circuit is provided which includes: a buffer circuit which includes a first transistor and a second transistor; a first element which counts to a first value based on a clock signal and outputs the first counted value; a second element which counts to a second value based on the clock signal and outputs the second counted value; a third element which controls the first element based on an output from the buffer circuit; a fourth element which controls the second element based on an output from the buffer circuit; a fifth element which inputs the first counted value and controls impedance of the first transistor based on the first counted value; and a sixth element which input the second counted value and controls impedance of the second transistor based on the second counted value.

According to another aspect of the present invention, an output buffer circuit is provided which includes: a buffer circuit; and a first circuit which inputs a reference potential and the potential of an output of the buffer circuit and controls the buffer circuit so that the potential of the output of the buffer circuit becomes close to the reference potential.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
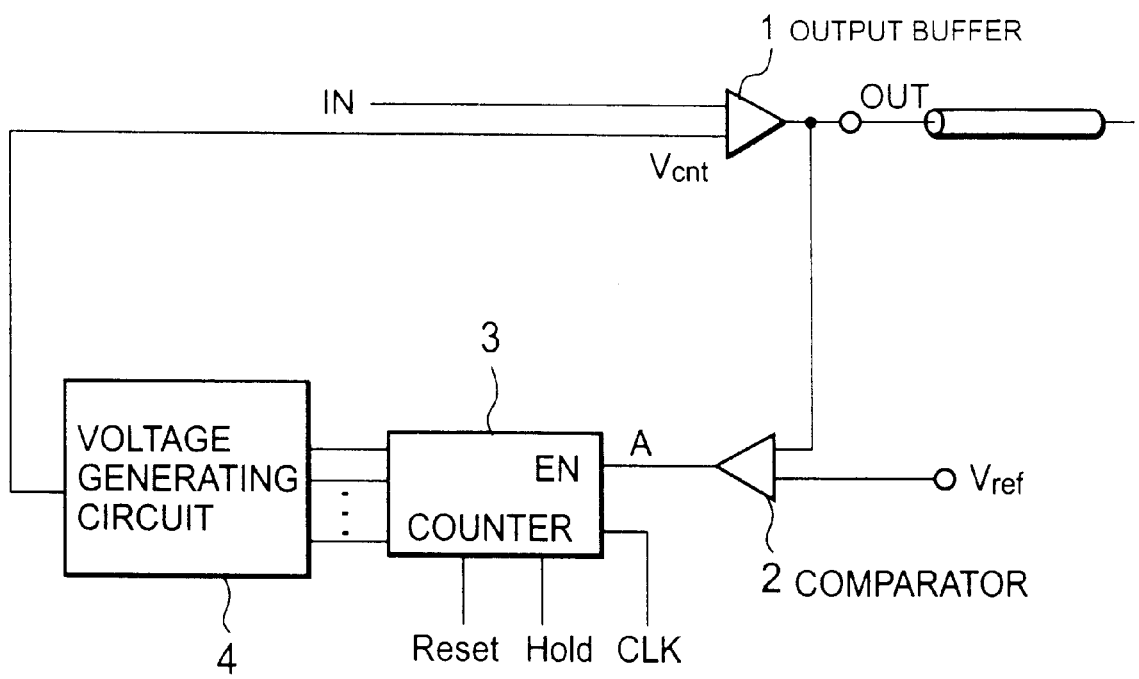
FIG. 1 is a circuit diagram of the embodiment of the present invention.

Referring to FIG. 1, a output buffer circuit of the present invention includes an output buffer 1, a comparator 2, a counter 3 and a voltage generating circuit 4. Output buffer 1 inputs an input signal IN and an external output signal Vcnt. Output buffer 1 has an impedance which can be changed based on external output signal Vcnt. An output signal OUT of output buffer 1 is negatively fed back through comparator 2.

Comparator 2 inputs a reference voltage Vref and output signal OUT. Comparator 2 compares output signal OUT with reference voltage Vref. An output signal from comparator 2 is input to counter 3 as an enable signal (EN) which is used to stop counting a clock signal CLK.

Counter 3 increases or decreases its counted value based on clock signal CLK. Counter 3 outputs each bit of the counted value. The bits output from counter 3 are input to voltage generating circuit 4 so that voltage generating circuit 4 generates signal Vcnt.

Voltage generating circuit 4 generates signal Vcnt which is used to control the output impedance of output buffer 1. Signal Vcnt output from voltage generating circuit 4 is negatively fed back to output buffer 1.

Figure 2:
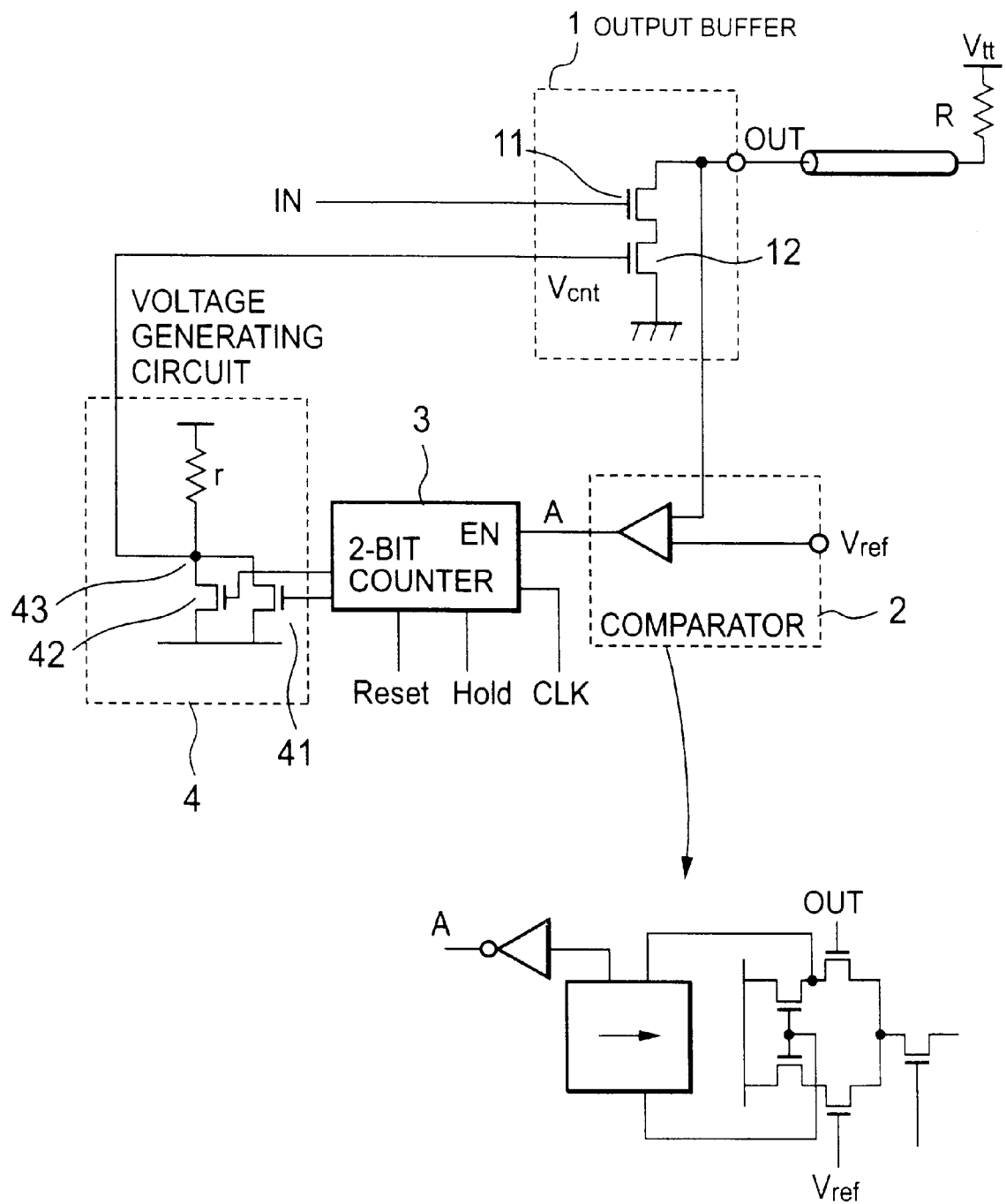
FIG. 2 is a circuit diagram of the embodiment of the present invention.

Referring to FIG. 2, output buffer 1 is an open drain buffer. Output buffer 1 includes N-channel transistors 11 and 12 which are connected in series. Transistor 11 has a control input where input signal IN is input. Transistor 12 has a control input where signal Vcnt is input.

Comparator 2 is formed of an inverter and two stages of differential buffers, each of which is an N-channel transistor load type.

Counter 3 is a 2-bit counter which inputs the clock signal, an enable signal, a hold signal and a reset signal and counts up its counted value. Voltage generating circuit 4 is formed of a load transistor r and N-channel transistors 41 and 42 connected in parallel. In this embodiment, because counter 3 is a 2-bit counter, voltage generating circuit 4 has two N-channel transistors and outputs four stages of output signal Vcnt based on four count values 11, 10, 01 and 00 from counter 3. The 2 bits output from counter 3 are input to the control terminals of transistors 41 and 42 inputs, respectively. One end of transistor 41 is connected to a terminal 43 and the other end of transistor 41 is connected to a potential terminal. One end of transistor 42 is connected to terminal 43. The other end of transistor 42 is connected to the potential terminal. One end of load transistor r is connected to terminal 43. Terminal 43 is an output terminal of voltage generating circuit 4 and connected to the control terminal of transistor 12.

Next, the operation of the embodiment will be described.

Figure 3:
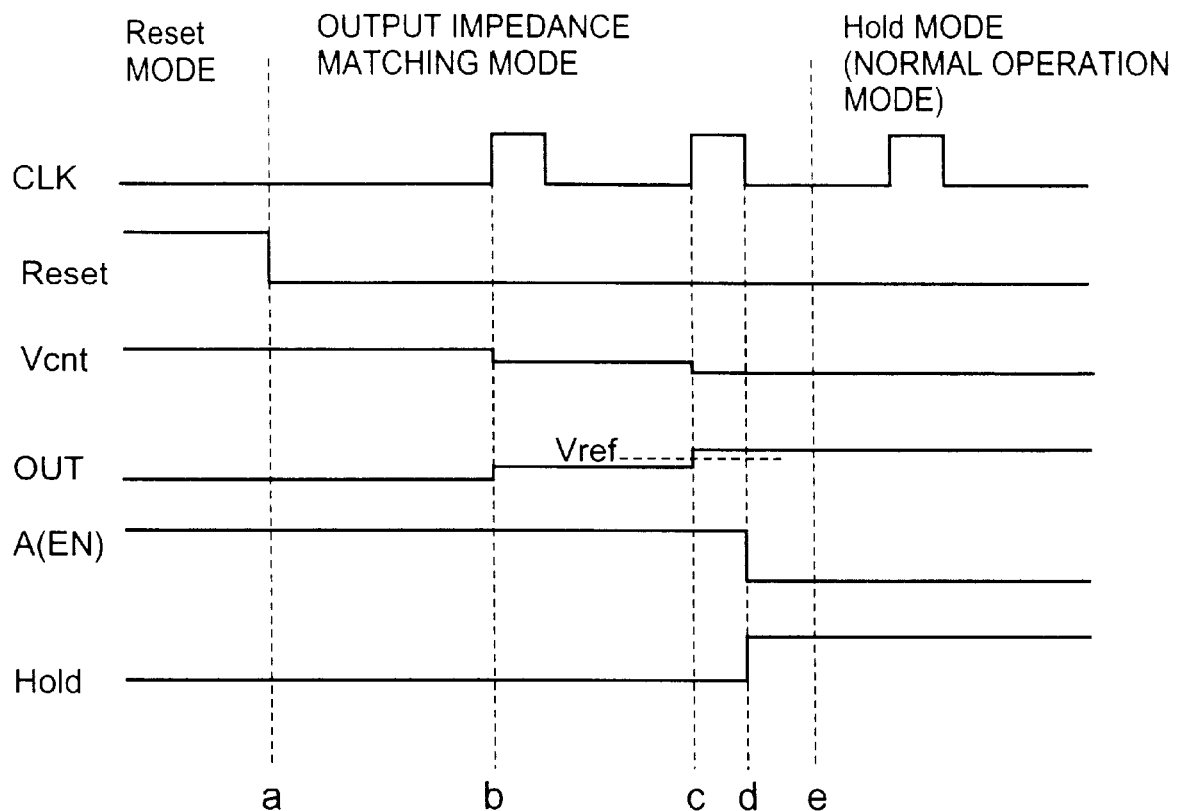
FIG. 3 is a timing chart of the present invention.

Referring to FIG. 3, in a reset mode, the reset signal input to counter 3 is high, and counter 3 is set to an initial value. The count values of counter 3 are all reset to 0. In this embodiment, the counter value becomes 00. The output impedance of output buffer 1 is fixed to an initial value.

When a output impedance matching mode starts, the reset signal input to counter 3 becomes low as shown at point a of FIG. 3. This reset signal is a start signal for a output impedance matching mode. In the output impedance matching mode, input signal IN to output buffer 1 needs to be controlled to become high. The reason for this is to measure the output impedance of output buffer 1. In addition, the frequency of clock signal CLK input to counter 3 needs to be set low enough to be used for the counting operation.

In the output impedance matching mode, voltage generating circuit 4 generates signal Vcnt which is used to increase or decrease the output impedance of output buffer 1.

When the value of output signal OUT from output buffer 1 is smaller than that of reference voltage Vref, an output signal A from comparator 2 is kept high and does not prevent clock signal CLK for counter 3 from supplying.

As shown at point b of FIG. 3, when clock signal CLK is input to counter 3, counter 3 increases its counted value by 1. The counted value becomes 01. This makes the level of signal Vcnt decrease. Signal Vcnt, whose value has decreased, makes the level of output signal OUT increase. Output signal OUT is again compared with reference voltage Vref by comparator 2.

If the level of reference voltage Vref is still higher than that of output signal OUT, output signal A of comparator 2 is kept high. Therefore, counter 3 further increases its counted value by 1 when the next clock signal CLK is input as shown at point c of FIG. 3. The counted value of counter 3 becomes 10. Signal Vcnt and output signal OUT are both changed in the same manner as described above.

When the value of output signal OUT becomes higher than that of reference voltage Vref as shown of point d of FIG. 3, output signal A of comparator 2 is inverted to low. Low level output signal A prevents counter 3 from increases its counted value even if clock signal CLK is input to counter 3. Thus, output signal A works as an enable signal to counter 3. Output signal A inactivates counter 3 when output signal A is low. The value of counter 3 is not counted even if clock signal CLK is input to counter 3, and therefore, the level of signal Vcnt output from voltage generating circuit 4 is not changed. Thus, the level of output signal OUT from output buffer 1 is not changed.

In this manner, impedance matching is completed. The hold signal to counter 3 becomes high so that the state of counter 3 is fixed.

In the embodiment, an open drain type output buffer is used as output buffer 1, however, it may be possible to use a CMOS type output buffer instead of the open drain type output buffer. In that case, it is possible to adjust the impedance of a P-channel transistor and an N-channel transistor. One set of a comparator, a counter and a voltage generating circuit are provided to each of the transistors.

While counter 3 counts up its counted value in the embodiment, it is possible to use a counter which counts down its counted value. It is also possible to use a counter which counts up and down its counted value as counter 3.

As described above, in the present invention, the output impedance of a buffer circuit can be set to a value that is equal to, or close to, the reference value. It is possible to change the output impedance when it is different from a desired value because of unevenness in an LSI, such as the dispersion in a threshold Vt, a gate length L, and the like, of a MOS transistor.

In addition, in the present invention, it is possible to adjust impedance even when the system is working. Therefore, unmatched impedance, which occurs when the system is working due to an extrinsic factor, such as the temperature variation or power source voltage fluctuation, can be corrected within the LSI. Thus, the reliability of the system can be enhanced.

While this invention has been described in conjunction with the preferred embodiments described above, it will now be possible for those skilled in the art to put this invention into practice in various other manners.

What is claimed is:

1. An output buffer circuit comprising:

a buffer circuit;

a first element which counts to a value based on a clock signal and outputs said counted value;

a second element which controls said first element based on an output from said buffer circuit; and a third element which inputs said counted value and controls impedance of said buffer circuit based on said counted value.

2. The output buffer circuit as claimed in claim 1, wherein said second element compares the potential of a reference potential and said output from said buffer circuit, and controls said first element based on the compared result.

3. The output buffer circuit as claimed in claim 2, wherein said second element activates said first element when said potential of said output from said buffer circuit is smaller than said reference potential.

4. The output buffer circuit as claimed in claim 2, wherein said second element prevents said first element from counting to said value when said potential of said output from said buffer circuit is larger than said reference potential.

5. The output buffer circuit as claimed in claim 1, wherein said third element generates an output potential based on said counted value.

6. The output buffer circuit as claimed in claim 5, wherein said output buffer includes a transistor which inputs said output potential and changes said impedance of said output buffer.

7. The output buffer circuit as claimed in claim 1, wherein said output buffer includes an open drain type transistor.

8. The output buffer circuit as claimed in claim 1, wherein said buffer circuit includes a transistor which inputs input potential, wherein said counted value includes a first and a second bit, and wherein said third element includes a first transistor which inputs said first bit and changes said input potential based on said first bit, and a second transistor which inputs said second bit and changes said input potential based on said second bit.

* * * * *